US005252960A

United States Patent [19]

Duhame

[11] Patent Number: 5,252,960

[45] Date of Patent: Oct. 12, 1993

[54] SECURE KEYLESS ENTRY SYSTEM FOR AUTOMATIC GARAGE DOOR OPERATOR

[75] Inventor: Dean C. Duhame, Roseville, Mich.

[73] Assignee: Stanley Home Automation, Novi, Mich.

[21] Appl. No.: 749,987

[22] Filed: Aug. 26, 1991

[51] Int. Cl.⁵ ...................... H03K 17/967; H03K 7/94; G06F 7/04; H03M 11/00

[52] U.S. Cl. ........................... 340/825.56; 340/825.31; 341/22; 341/176; 361/171; 361/172

[58] Field of Search ....................... 340/825.56, 825.57, 340/825.31, 825.32, 825.58, 825.69, 825.72; 341/20, 176, 22; 455/66, 68, 70, 95, 99; 361/171, 172

[56] References Cited

U.S. PATENT DOCUMENTS

| | | | |
|---|---|---|---|
| 3,633,167 | 1/1972 | Hedin | 340/825.32 |
| 3,805,246 | 4/1974 | Colucci et al. | 340/825.31 |
| 4,064,487 | 12/1977 | Russell et al. | 340/825.58 |
| 4,205,325 | 5/1980 | Haygood et al. | 340/825.56 |
| 4,404,558 | 9/1983 | Yen | 341/20 |
| 4,665,397 | 5/1987 | Pinnow | 340/825.56 |
| 4,692,762 | 9/1987 | Lewiner et al. | 340/825.72 |
| 4,754,255 | 6/1988 | Sanders et al. | 341/176 |
| 4,786,900 | 11/1988 | Karasawa et al. | 340/825.31 |
| 4,932,054 | 6/1990 | Chou et al. | 340/825.31 |
| 5,077,831 | 12/1991 | Weber | 340/825.72 |

*Primary Examiner*—John K. Peng
*Assistant Examiner*—Andrew Hill
*Attorney, Agent, or Firm*—Krass & Young

[57] ABSTRACT

A secure, keyless secondary transmitter unit for use in an automatic garage door operator transmits a code set by a code setting device as modified by digits entered at a keyboard. A controller constructs an identification code by inverting bits of the code set by the code setting device that correspond to entered digits. A radio frequency transmitter transmits this altered code in the manner of known automatic garage door operators. Thus operation of keys corresponding to the bits that differ between the receiver code and the secondary transmitter code controls the door. The keyboard preferably also includes an entry complete key indicating entry of the complete digit sequence and a clear key to restart the digit sequence. A lamp connected to the controller illuminates the keyboard upon operation of any key at the keyboard and is turned off if no key is operated in a predetermined period of time. Further operation of the entry complete key within this predetermined period of time causes the controller to again construct and transmit the same code. This secure keyless transmitter unit is believed to be as secure as the primary transmitter units, even when permanently mounted outside the controlled door.

22 Claims, 2 Drawing Sheets

SECURE KEYLESS ENTRY SYSTEM FOR AUTOMATIC GARAGE DOOR OPERATOR

TECHNICAL FIELD OF THE INVENTION

The technical field of the present invention is automatic garage door operators and more particularly secure secondary transmitters for controlling the door operator

BACKGROUND OF THE INVENTION

Automatic garage door operators controlled by radio frequency transmitters are well known in the art. The typical automatic garage door operator of this type facilitates access to the garage by automobile. Activation of a transmitter enables operation of the garage door without the need to exit the automobile to manually operate the door.

The typical system requires transmission of an encoded signal for security purposes. The receiver, which is located within the space enclosed by the garage door, compares the received code with a stored code and operates the door only if these codes match. Without access to the particular code of that receiver, unauthorized operation is substantially prevented. The current art generally employs a digital code modulated on the radio frequency signal produced by the transmitter. Both the transmitter and the receiver typically set this digital code by user selection of the switch positions of a bank of switches. Each switch selects the "0" or "1" sense for a corresponding bit in the digital code. Selection of identical switch patterns in the transmitter and receiver ensures that the receiver is responsive to the encoded signal produced by the transmitter. User selection of the code enhances the security of the system. A typical system employs 10 bits permitting about one thousand different codes.

There is occasional need for ambulatory operation of the garage door. This would occur, for example, when the user desires to use lawn care tools stored in the garage without leaving the garage door open. There are several ways known in the prior art permitting such ambulatory access. First, the user may carry one of the ordinary transmitter units. This tends to be inconvenient because of the bulk of the transmitter unit. Further, an unauthorized person having momentary access to the transmitter unit could open it and read the code set via the switches. This compromises the security of the automatic door operator. Second, a switch operated by an ordinary mechanical key may be disposed on the outside of the controlled door. The user carries the corresponding key and controls the door by operation of the switch. This requires the user to carry the key that may be inconvenient. In addition, this reduces the security of the system because the key operated switch is subject to physical attack. Some key operated switches used in this manner are easily removed providing unauthorized access to the electrical wires that may then be manipulated to simulate the switch action.

Therefore there is a need in the art for a secure manner of ambulatory access to a garage door controlled by an automatic operator This need would best be met by a unit that can be permanently mounted outside the controlled door. It would be advantageous if such an externally mounted unit did not compromise the security of the automatic door operator.

SUMMARY OF THE INVENTION

This invention is a secure, keyless secondary transmitter unit for use in an automatic garage door operator. The automatic garage door operator includes a receiver constructed to control operation of a garage door upon receipt of an encoded radio frequency transmission having a predetermined digital identification code of a predetermined number of bits. The receiver includes a manual code setting device for setting this predetermined digital identification code. This receiver is employed with one or more primary transmitter units having the same predetermined digital identification code set via a similar manual code setting device.

The secure keyless secondary transmitter unit of this invention includes: a manually operable code setting device; a keyboard; a controller; and a radio frequency transmitter. The user sets the code setting device to a code similar to the code set in the receiver, except that selected bits are inverted The keyboard includes plural code keys, preferably digit keys, which may be operated by the user. The controller constructs an identification code from the code set by the code setting device and the operated digit keys. Operation of keys corresponding to the bits that differ between the receiver and the secondary transmitter code setting devices causes the controller to construct an identification code matching the predetermined identification code of the receiver. The radio frequency transmitter transmits this identification code. Thus operation of the proper keys at the keyboard controls the garage door.

In the preferred embodiment, the code setting devices are all sets of 10 switches disposed in a dual in line package, capable of setting a 10 bit digital identification code. The keyboard preferably includes at least the decimal digits "1" to "0" corresponding to these 10 bits. The keyboard preferably also includes an entry complete key indicating completion of the digit sequence and a clear key to restart the digit sequence.

A lamp connected to the controller illuminates the keyboard upon operation of any key at the keyboard This lamp is preferably a light emitting diode. Illumination of this lamp indicates the receipt of a key stroke The lamp is turned off if no key is operated in a predetermined period of time. An additional lamp, preferably also a light emitting diode, illuminates whenever a key is pressed.

The controller stores the operated digits for the predetermined period of time the lamp is illuminated. Further operation of any key within this predetermined period of time causes the controller to again construct and transmit the same code. The stored digits are cleared when the predetermined period of time expires.

This secure keyless transmitter unit is believed to be as secure as the primary transmitter units, even when permanently mounted outside the controlled door. The user always retains the possibility of changing the base code or of changing the relationship between this base code and the code set in the secure keyless transmitter unit and thus the digit keys that must be operated to control the door.

BRIEF DESCRIPTION OF THE DRAWINGS

These and other objects and aspects of the present invention will become clear from the following description of the invention, in which.

DETAILED DESCRIPTION OF THE PREFERRED EMBODIMENTS

Figure 1:
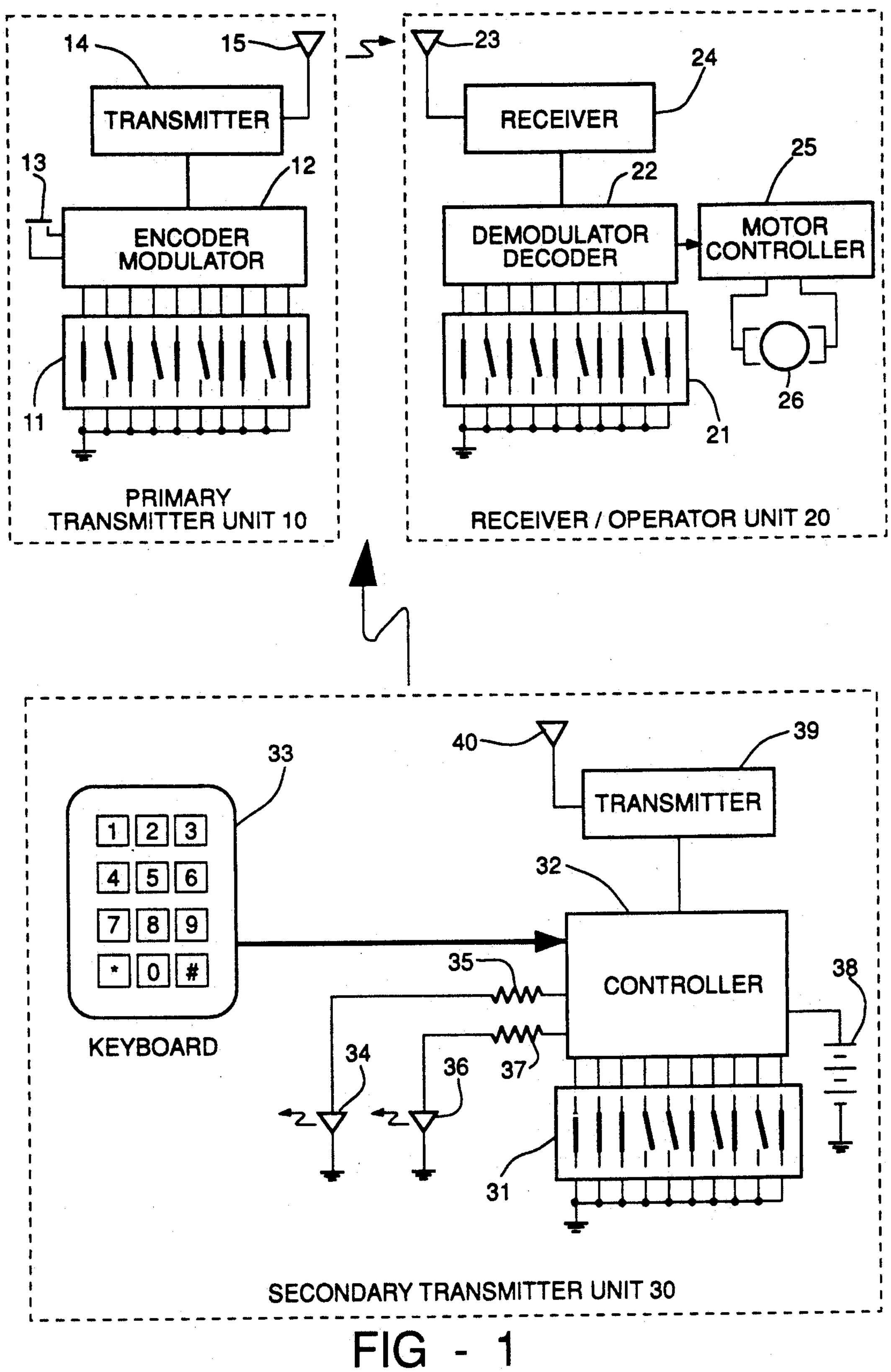
FIG. 1 illustrates in block diagram form the construction of an automatic garage door operator system of this invention.

FIG. 1 illustrates an example of an automatic garage door operator that employs the present invention. The system includes one or more primary transmitter units 10, a receiver/operator unit 20 and a secondary transmitter unit 30. In summary, both primary transmitter unit(s) 10 and secondary transmitter unit 30 transmit encoded radio frequency signals. Receiver/operator unit 20 receives these radio frequency signals and controls operation of the garage door only if the received signal is encoded with a code that matches the receiver code. Both primary transmitter unit(s) 10 and receiver/operator unit 20 operate according to the known art of automatic garage door operators.

Each primary transmitter unit 10 includes a code setting device 11 that determines the encoding of the transmitted radio frequency signal. According to the known art, code setting device 11 is a set of manually operable switches. Each switch has two positions for selection of a digital "1" or "0" for the corresponding bit of the code. It is known in the art to provide the set of switches in a dual in line package. This package is of the same type used to house integrated circuits and is readily mounted on a printed circuit board. It is also known in the art to provide such a code setting device with 10 switches permitting the setting of one of $2^{10}$ or 1024 possible codes.

Primary transmitter unit 10 operates as follows. Upon depression of push button switch 13, encoder/modulator 12 reads the switch setting of transmitter code setting device 11. Encoder/modulator 12 then enables transmitter 14. At the same time, encoder/modulator 12 modulates the radio frequency signal generated by transmitter 14 with the transmitter code read from transmitter code setting device 11. Thus transmitter 14 transmits a radio frequency signal via antenna 15 that is modulated or encoded by a digital signal corresponding to the setting of transmitter code setting device 11. Although not illustrated in FIG. 1, it is conventional to power primary transmitter unit 10 via internal batteries. The whole primary transmitter unit 10 is typically constructed in a hand held package.

Receiver/operator unit 20 is responsive to radio frequency signals for control of door operation. Antenna 23 and receiver 24 receive radio frequency signals such as transmitted by primary transmitter unit(s) 10. Demodulator/decoder 22 demodulates any code modulated on this received radio frequency signal. Demodulator/decoder 22 also determines if the demodulated code matches the code set by receiver code setting device 21. Receiver code setting device 21 is preferably a set of switches disposed in a dual in line package of the same type as code setting device 11. Demodulator/decoder 22 supplies an operation signal to motor controller 25 only if the code modulated on the received radio frequency signal coincides with the code set by receiver code setting device 21.

Motor controller 25 supplies corresponding operating power to motor 26 for opening and closing the garage door when triggered by demodulator/decoder 22. Motor 26 is mechanically coupled to the door in a manner known in the art. It is known in the art to operate the door in a circular four phase sequence to open the door, stop, close the door, and stop upon each receipt of a properly encoded radio frequency signal. It is also known in the art to provide stops to end motor operation upon reaching the fully closed and the fully opened positions. These features of the system are conventional forming no part of the invention and thus will not be further described.

The provision of a multibit signal encoded in the radio frequency transmissions serves a security function. This insures that receiver/operator 20 is not responsive to every radio frequency transmission but only to those properly encoded. Transmission of the properly encoded signal is analogous to selection of the proper key for operating a lock. Provision of code setting devices 11 and 21 as manually operable switches permits the user to control the code used. Generally code setting devices 11 and 21 may be accessed only by opening door or removing a panel. The user may at any time select an arbitrary one of the 1024 feasible codes by changing the switches in code setting device 21. A similar change made in code setting device 11 in each of the primary transmitter units 10 permits these units to control to door.

Secondary transmitter unit 30 is designed to be permanently disposed on the outside of the controlled door. Thus some additional measure is needed to provide security in the door operation. Secondary transmitter unit 30 requires the input of a set of digits via a keyboard in order to produce a properly encoded radio frequency signal.

Secondary transmitter unit 30 is constructed similar to primary transmitter unit(s) 10. Secondary transmitter unit includes a code setting device 31, a controller 32, a transmitter 39 and an antenna 40, which correspond to structures in primary transmitter unit(s) 10. Secondary transmitter unit 30 additionally includes a keyboard 33, a light emitting diodes 34 and 36, resistor 35 and 37, and a battery 38.

Keyboard 33 includes the ten digits "1" to "0" and the function keys "*" and "#". FIG. 1 illustrates keyboard 33 laid out in the same fashion as a telephone keyboard. This provides a familiar key pattern but is not required by the present invention. Other arrangements of the keys are suitable.

Light emitting diode 34 illuminates keyboard 33. Upon operation of any key at keyboard 33, controller 32 supplies electric power to resistor 35 illuminating light emitting diode 34. Resistor 35 limits the current through light emitting diode 34. Light emitting diode 34 is disposed to illuminate keyboard 33 permitting operation in the dark. Illumination of light emitting diode 34 also serves to indicate the receipt of the first key stroke. Controller 32 preferably turns off light emitting diode 34 a predetermined interval after the last operation of keyboard 33 to conserve electric power. Note that only one light emitting diode is illustrated, however those skilled in the art would realize that plural light emitting diodes or another type of electrical lamp could be employed.

Light emitting diode 36 provides an indication of key entry. Upon operation of any key at keyboard 33, controller 32 supplies electric power to resistor 37 illuminating light emitting diode 36. Resistor 37 limits the current through light emitting diode 36. Illumination of light emitting diode 36 can occur for any convenient lenght of time, such as 500 milliseconds, upon each key entry. Thus light emitting diode provides an indication during individual key strokes. This indication aids the operator in entering the code for opening the door.

Battery 38 is illustrated in FIG. 1 to explicitly indicate that secondary transmitter unit 30 is preferably battery powered.

In use certain digit keys of keyboard 33 are operated followed by operation of the "*" key. Controller 32 then recalls the code set by code setting device 31. Controller 32 forms the transmitted code based upon both the code set by code setting device 31 and the operated digit keys. As better illustrated in FIG. 2, the code set at code setting device 31 does not coincide with the code set at code setting devices 11 and 21.

Figures 2, 3:
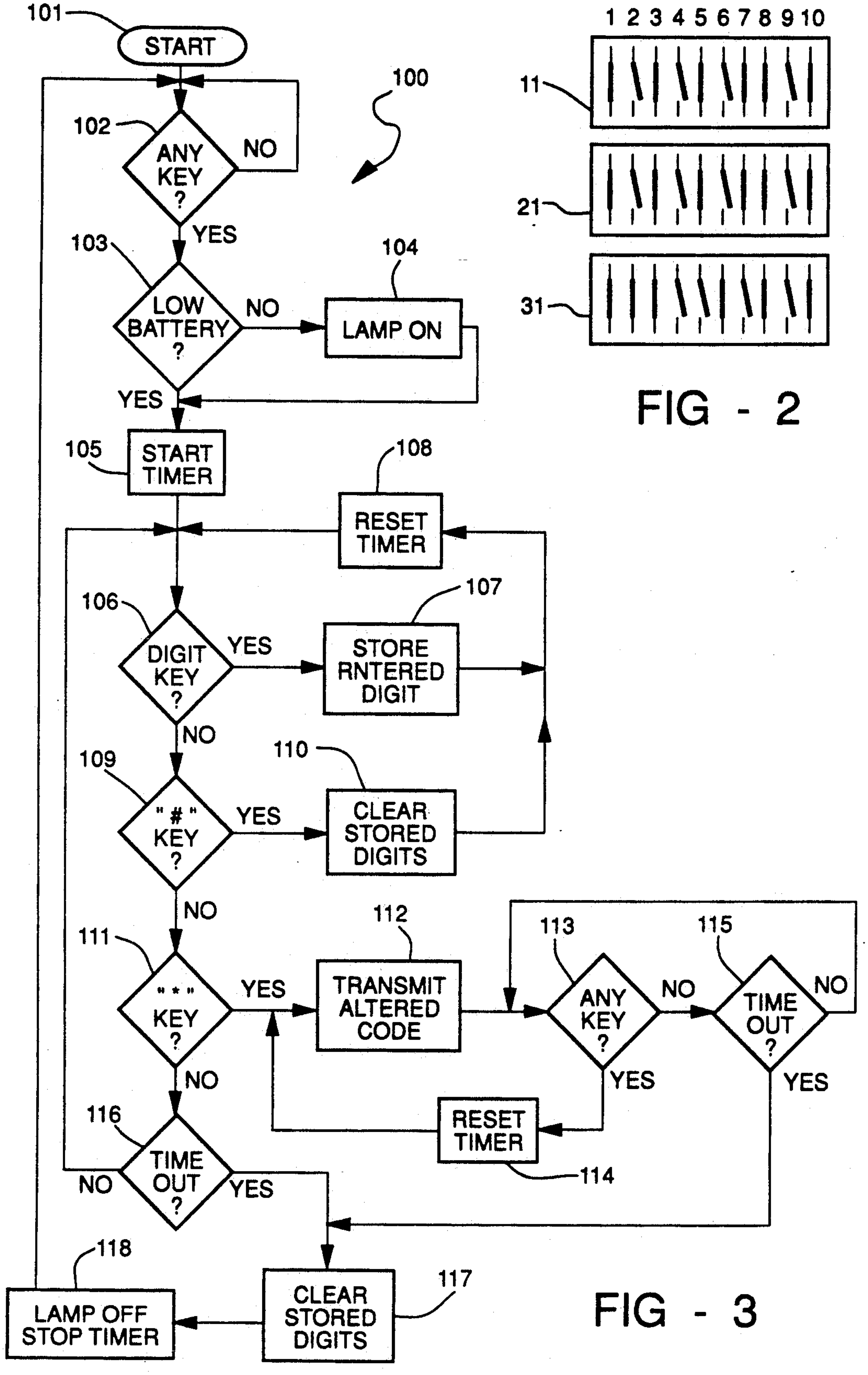
FIG. 2 illustrates a side-by-side comparison of the identification code setting switches of the primary transmitter unit, the receiver/operator unit and the secure keyless secondary transmitter unit in an example of this invention.
FIG. 3 illustrates in flow chart form the operation of the secure keyless secondary transmitter unit in this invention.

FIG. 2 illustrates code setting devices 11, 21 and 31 side by side in a manner better showing the relationship between the codes set. If an open switch represents a digital "1" and a closed switch represents a digital "0", then code setting devices 11 and 21 each set a digital code of "0101010010". Code setting device 31 sets a differing code, namely "0001101010". Note that the code set by code setting device 31 differs from the code set by code setting devices 11 and 21 in that the second, fifth, sixth and seventh bits are inverted. The other bits of the code set in code setting device 31 are the same as the corresponding bits in code setting devices 11 and 21.

Secondary transmitter unit 30 operates by inverting selected bits of the code set by code setting device 31. The bits inverted correspond to the operated digit keys. In the present example, operation of "2", "5", "6", "7" and "*" at keyboard 33 causes controller 32 to invert the second, fifth, sixth and seventh bits of the code "0001101010" set by code setting device 31. In this example the thus modified code is "0101010010", which is the code of receiver/operator unit 20 set by code setting device 21. Thus receiver/operator unit 20 receives the proper code to operate the door. It should be clear that operation of "0" at keyboard 33 is effective to cause inversion of the tenth bit of the code set by code setting device 31.

Program 100 illustrated in FIG. 3 is an example of the operating sequence of controller 32. In this example controller 32 is a microprocessor circuit permanently programmed via read only memory according to program 100. Note program 100 illustrated in FIG. 3 does not show the exact details of the operation of controller 32. These exact details are dependant on the design choice of microprocessor used to embody controller 32. Program 100 does show the general outlines of the process sufficient to enable one skilled in microprocessor programming to construct this invention upon selection of the microprocessor and its corresponding instruction set. It is feasible to produce the same resultant using hardwired logic or a programmed logic array as controller 32. In any event, program 100 illustrates the processes necessary to practice this invention.

Program 100 begins at start block 101. Start block 101 preferably includes processes normally executed upon initial application of electric power to secondary transmitter unit 30. These processes are well known in the art and will not be further discussed.

Program 100 tests to determine if any key is operated (decision block 102). This test is preferably made in a low power mode to conserve battery 36. If decision block 102 detects no key operation, then decision block 102 is repeated. Secondary transmitter unit 30 remains in this state, repeatedly checking for a key operation, until detection of a key operation. In the event that the test of decision block 102 operates in a low power mode, satisfaction of the test processing block 102 also causes secondary transmitter unit 30 to enter a normal power mode.

Detection of a key operation begins the operation of secondary transmitter unit 30. Program 100 first determines if the battery power is low (decision block 103). If this is not the case, program 200 turns on light emitting diode 34 by supply of electric power through resistor 35 (processing block 104). Illumination of light emitting diode 34 permits the user to view keyboard 33 in the dark and acknowledges entry of the first key stroke. If the battery power is low, then program 300 does not turn on light emitting diode 34. This serves to indicate to the user that the battery power is low. Other functions will continue until the battery power is too low to power them. Not illustrated in FIG. 3 but understood throughout is the illumination of light emitting diode 36 during operation of any key.

In either event, program 300 starts a timer (processing block 105). The timer in secondary transmitter unit 30 controls the length of time light emitting diode 34 is illuminated, the length of time operated digits are stored and reentry into the low power mode if a low power mode is used. The length of the timer will be discussed below.

Program 100 next enters a section that takes differing action based upon the operated key. There are three types of keys: the digit keys "1" to "0"; the "#"key; and the "*" key. These key types are handled differently.

Upon detection of the operation of a digit key (decision block 106), the identity of the operated digit key is stored (processing block 107). Controller 32 includes some form of digital memory for this purpose. This data will be used in determination of the code modulated on the radio frequency transmissions of secondary transmitter unit 30. Upon storage of this operated digit, the timer started in processing block 105 is reset (processing block 108). This serves to provide the entire interval of the timer following the last operated key.

Upon detection of operation of the "#"key (decision block 109), the data corresponding to the operated digit keys is cleared (processing block 110). This permits the user to recover from a mistaken digit operation by restarting the process. Once the digit data is cleared, the timer is reset (processing block 108).

Upon detection of the operation of the "*" key (decision block 111), secondary transmitter unit 30 transmits a radio frequency signal (processing block 112). Secondary transmitter unit 30 encodes the radio frequency signal according to the code set by code setting device 31 and the operated digit keys. First, program 100 reads the code set by code setting device 31. Next a new code is constructed by inverting bits of the code of code setting device 31 corresponding to the stored digits. In the example of FIGS. 1 and 2, the digit keys "2", "5", "6" and "7" are operated and an indication of each is stored. The new code is then formed by inversion of the second, fifth, sixth and seventh digits of the code "0001101010" set by code setting device 31 upon operation of the "*" key. This new code is "0101010010", which is the code of receiver/operator unit 20 set by code setting device 21. Secondary transmitter unit 30 then transmits this code. Transmitter 39 produces a radio frequency signal for application to antenna 40 modulated by the modified code. Receiver/operator unit 20 recognizes this modified code and then operates the door according to the known art.

Following transmission of the altered identity code, program 300 tests for the entry of any key (processing block 113). If this occurs then the timer is reset (processing block 114) and the altered identity code is transmitted (processing block 112). This permits the user to repeat transmission of the altered identity code without requiring reentry of the entire digit sequence. If no key has been entered, program 300 tests to determine if the timer has expired (decision block 115). If this is not the case, then the test of decision block 113 is repeated. Program 300 remains in this loop, until the timer has expired.

In the event that no key operation is detected by decision blocks 106, 109 or 111, then program 100 tests to determine if the interval of the timer has expired (decision block 116). In the event that the timer has not expired, control of the program 100 returns to the beginning of the key operation loop at decision block 106 without resetting the timer. The interval of the timer is longer than the longest expected time required for the door to move from fully open to fully closed or vice versa. This time interval should be about thirty seconds. Current regulatory rules require the door to be completely opened or closed within a thirty second interval.

Eventually the time interval of the timer will expire. This may occur without the transmission of an altered identity code (decision block 116) or following one or more transmissions of an altered identity code (decision block 115). When this occurs the stored digits are cleared (processing block 117). Secondary transmitter unit 30 thus no longer retains the digits needed to modify the code to the code of receiver/operator 20. Then light emitting diode 34 is turned off and the timer stopped (processing block 118). Since the operation is complete, there is no longer a need to light keyboard 33. In addition, the extinguishing of light emitting diode 34 shows the user that secondary transmitter unit 30 no longer stores the operated digits. Thus further operation of the door will require reentry of these digits. Note that so long as light emitting diode 34 remains illuminated, the operator can repeat transmission of the altered identity code by depression on any key (blocks 112 to 115). In the event that a low power mode is employed, then this low power mode is reentered. Control then passes to decision block 102 which continually tests for the operation of any key.

Secondary transmitter unit 30 of this invention can be permanently mounted outside the door without compromising the security of the automatic door operator. An unauthorized person may open secondary transmitter unit 30 and read the code of code setting device 31. This does not indicate the code of receiver/operator 20 because the code set by code setting device 31 differs from the code set by code setting device 21 in one or more bits. Secondary transmitter unit 30 provides no indication of which bits are different. Once the timer expires, secondary transmitter unit 30 stores no information that would indicate the differences between the two codes. Even during the interval that secondary transmitter unit 30 stores the operated digits, these are stored in an internal digital memory not subject to visual detection. Note that the number of digits entered to transmit the altered code may be any number between 0 and 10. This number of digits needed corresponds to the number of digits by which the code of code setting device 31 differs from the code of code setting device 21. In order to obtain the receiver/operator code, the unauthorized person would need to obtain access to secondary transmitter unit 30, read code set by code setting device 31 and somehow determine the digits stored in controller 32, all during the interval of the timer following correct entry of the code by an authorized user. This eventuality is so unlikely that the security of the secondary transmitter unit 30 is at least as great as that of the primary transmitter unit 10. The user always retains the possibility of changing the base code of the primary transmitter unit 10 and the receiver/operator 20. The user also retains the possibility of changing the relationship between this base code and the code set by code setting device 31, and thus the digit keys that must be operated to control the door.

The method of the invention for controlling the operation of a garage door by a receiver unit and a transmitter unit comprises setting a multi-bit digital identification code word in the receiver unit, setting a base multi-bit digital code in the transmitter unit wherein the base code corresponds to the code word in the receiver except that selected ones of the bits are inverted. The user operates one or more keys of a keyboard at the transmitter unit wherein the keys each correspond to one of the bits of the base code and a record of the operated keys is stored. The user can clear the memory in case an entry error is made by operating a clear key. After the code keys are operated an entry complete key is operated and an altered code is formed by changing the base code by inverting the bits which correspond to the operated keys as identified in the record, therefore forming an altered code which matches the code word in the receiver is the correct keys were operated, and a radio frequency signal encoded with the altered code is transmitted. The receiver unit receives a signal and if that signal is properly encoded with the digital identification code word the door is operated. After a time period following the entry key operation, the record of operated code keys is cleared. Before the period expires the radio transmission of the altered code can be repeated by operating any key of the keyboard. The keyboard is illuminated when the first key is operated and the illumination is turned off when the time period expires.

I claim:

1. In an automatic garage door operator including a receiver constructed to control operation of a garage door upon receipt of an encoded radio frequency transmission having a predetermined digital identification code word of a predetermined number of bits, a secure keyless entry transmitter unit comprising:

- a manually operable code setting device for setting a base digital code having a number of bits equal to the predetermined number of bits of the predetermined digital identification code word and corresponding to said predetermined digital identification code word with predetermined bits inverted;
- means for selecting bits of the base digital code for inversion comprising a keyboard including a plurality of manually operable code keys, each key corresponding one-to-one to a respective bit of the base digital code;

a controller connected to said code setting device and said keyboard operative to form an altered code corresponding to said base digital code set by said code setting device with selected bits corresponding to operated code keys inverted, whereby the altered code matches the predetermined digital identification code word if code keys corresponding to said predetermined bits are operated; and a radio frequency transmitter connected to said controller for transmitting a radio frequency signal encoded with said altered code.

2. The secure keyless transmitter as claimed in claim 1, wherein:

said keyboard includes code keys equal in number to the predetermined number of bits of the predetermined digital identification code word.

3. The secure keyless transmitter as claimed in claim 2, wherein:

said code setting device sets a base digital code of 10 bits; and said keyboard includes code keys of the decimal digits "1" to "0".

4. The secure keyless transmitter as claimed in claim 3, wherein:

said code setting device consists of 10 switches disposed in a dual in line package, one switch corresponding to each bit of said base digital code.

5. The secure keyless transmitter as claimed in claim 1, further comprising:

a lamp connected to said controller disposed to illuminate said keyboard; and said controller is further operative to turn on said lamp upon operation of any key, and turn off said lamp if no key is operated within a predetermined period of time.

6. The secure keyless transmitter as claimed in claim 1, wherein:

said keyboard further includes an entry complete key; and said controller is further operative to form said altered code upon operation of said entry complete key.

7. The secure keyless transmitter as claimed in claim 1, wherein:

said keyboard further includes an entry complete key and a clear entry key; and said controller is further operative to store a record of operated code keys, form said altered code corresponding to the base digital code set by said code setting device with bits corresponding to said record of operated code keys inverted upon operation of said entry complete key, and clear said record of operated code keys upon operation of said clear entry key.

8. The secure keyless transmitter as claimed in claim 7, wherein:

said controller is further operative to clear said record of operated code keys if no key is operated within a predetermined period of time.

9. The secure keyless transmitter as claimed in claim 8, wherein:

said controller is further operative to again form said altered code corresponding to the base digital code set by said code setting device with bits corresponding to said record of operated code keys inverted upon further operation of any key within said predetermined period of time.

10. A secure keyless entry system for operation of a door comprising:

an automatic door operator including a manually operable receiver code setting device for setting a digital identification code word having a predetermined number of bits;

a radio frequency receiver for receiving radio frequency transmissions encoded with digital identification codes, a demodulator/decoder connected to said receiver code setting device and said radio frequency receiver for generating an operation signal if said radio frequency receiver receives a radio frequency transmission encoded with a digital identification code matching said digital identification code word set by said receiver code setting device, a motor coupled for movement of the door between a fully open position and a fully closed position, and a motor controller connected to said demodulator/decoder and said motor for controlling said motor for movement of the door between said fully open position and said fully closed position upon receipt of said operation signal;

a secure keyless transmitter unit including a manually operable transmitter code setting device for setting a base digital code having said predetermined number of bits and corresponding to said predetermined digital identification code word with predetermined bits inverted, means for selecting bits of the base digital code for inversion comprising a keyboard including a plurality of manually operable code keys, each key corresponding one-to-one to a respective bit of the base digital code;

a controller connected to said transmitter code setting device and said keyboard operative to form an altered code corresponding to the base digital code set by said transmitter code setting device with selected bits corresponding to operated code keys inverted, and a radio frequency transmitter connected to said controller for transmitting a radio frequency signal encoded with said altered code;

whereby upon setting of said transmitter code setting device having predetermined bits inverted with respect to the corresponding bits of said receiver code setting device and operation of code keys corresponding to said predetermined bits, said altered code equals said digital identification code word.

11. The secure keyless entry system as claimed in claim 10, wherein:

said keyboard includes code keys equal in number to the number of bits of the predetermined digital identification code word.

12. The secure keyless entry system as claimed in claim 11, wherein:

said receiver code setting device and said transmitter code setting device each set a digital code of 10 bits; and said keyboard includes code keys of the decimal digits "1" to "0".

13. The secure keyless entry system as claimed in claim 12, wherein:

said receiver code setting device and said transmitter code setting device each consist of 10 switches disposed in a dual in line package, one switch corresponding to each bit of the respective digital code.

14. The secure keyless entry system as claimed in claim 10, wherein:

said keyboard further includes a manually operable entry complete key, and said controller is further operative to store a record of operated code keys, form said altered code corresponding to the base digital code set by said code setting device with inversion of bits corresponding to operated code keys stored in the record upon operation of said entry complete key, and clear said record of operated code keys a predetermined period of time following operation of said entry complete key.

15. The secure keyless entry system as claimed in claim 14, wherein:

said controller is further operative to again form said altered code within said predetermined period of time.

16. The secure keyless entry system as claimed in claim 14, wherein:

said keyboard further includes a manually operable clear entry key, and said controller is further operative to clear said record of operated code keys upon operation of said clear entry key.

17. The secure keyless entry system as claimed in claim 14, wherein:

said secure keyless transmitter unit further includes a lamp connected to said controller disposed to illuminate said keyboard, said controller is further operative to turn on said lamp upon operation of any key, turn off said lamp said predetermined period of time following operation of said entry complete key.

18. A method of automatically operating a door via a receiver unit and a transmitter unit comprising the steps of:

setting a predetermined digital identification code word at the receiver nit, the code word consisting of a plurality of bits;

manually setting a base digital code of a plurality of bits at the transmitter unit corresponding to said predetermined digital identification code word with selected bits inverted;

operating at least one code key via a keyboard including a plurality of manually operable code keys at the transmitter unit, wherein each key corresponds one-to-one to a bit of the base digital code;

transmitting a radio frequency signal from the transmitter unit encoded with an altered code corresponding to said base digital code set at the transmitter unit with a bit corresponding to each operated code key inverted;

receiving a radio frequency signal at the receiver unit; and operating the door if said radio frequency signal received at the receiver unit is encoded with an altered code that matches said predetermined digital identification code word.

19. The method of automatically operating a door as claimed in claim 18 further comprising the steps of:

illuminating said keyboard upon operation of any key; and ending said illumination of said keyboard if no key is operated within a predetermined period of time.

20. The method of automatically operating a door as claimed in claim 18 further comprising the steps of:

storing a record of operated code keys at the transmitter unit;

operating an entry complete key via said keyboard at the transmitter unit;

forming said altered code corresponding to said base digital code set at the transmitter unit with bits corresponding to said operated code keys stored in the record inverted upon operation of said entry complete key at the transmitter unit; and clearing said record of operated code keys at the transmitter unit a predetermined period of time following operation of said entry complete key.

21. The method of automatically operating a door as claimed in claim 20 further comprising the step of:

again forming said altered code corresponding to the base digital code set at the transmitter unit with inverted bits corresponding to said stored indication of operated code keys stored in the record upon further operation of any key within said predetermined period of time.

22. The method of automatically operating a door as claimed in claim 20 further comprising the step of:

operating a clear entry key via said keyboard at the transmitter unit; and clearing said record of operated code keys at the transmitter unit upon operation of said clear entry key.

* * * * *